United States Patent
Lin

(10) Patent No.: US 10,264,708 B2
(45) Date of Patent: Apr. 16, 2019

(54) ELECTRONIC DEVICE AND HEAT DISSIPATION MODULE THEREOF

(71) Applicant: Quanta Computer Inc., Taoyuan (TW)

(72) Inventor: Yun-Jeng Lin, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 15/652,751

(22) Filed: Jul. 18, 2017

(65) Prior Publication Data

US 2018/0317343 A1 Nov. 1, 2018

(30) Foreign Application Priority Data

Apr. 28, 2017 (TW) .............................. 106114342 A

(51) Int. Cl.
 *G06F 1/20* (2006.01)
 *H05K 7/20* (2006.01)
 *H01L 23/427* (2006.01)

(52) U.S. Cl.
 CPC ......... *H05K 7/20336* (2013.01); *G06F 1/203* (2013.01); *H01L 23/427* (2013.01); *H05K 7/20509* (2013.01)

(58) Field of Classification Search
 CPC ..................... H05K 7/20336; H05K 7/20436; G06F 1/203; H01L 23/427
 See application file for complete search history.

(56) References Cited

U.S. PATENT DOCUMENTS

| | | | | |
|---|---|---|---|---|
| 6,795,312 B2* | 9/2004 | Narakino | .............. | F28D 1/0308 165/151 |
| 7,177,154 B2* | 2/2007 | Lee | ......................... | G06F 1/181 165/104.33 |
| 7,277,286 B2* | 10/2007 | Lee | ............................ | G06F 1/20 174/15.2 |
| 7,342,788 B2* | 3/2008 | Nikfar | ................. | F28D 15/0233 165/104.33 |
| 7,518,861 B2* | 4/2009 | Lev | ......................... | G06F 1/203 165/104.33 |
| 7,548,426 B2* | 6/2009 | Liu | ...................... | H01L 23/4006 165/104.21 |
| 7,599,185 B2* | 10/2009 | Meyer, IV | ............ | H01L 23/427 165/104.21 |
| 7,609,520 B2* | 10/2009 | Chang | ................. | F28D 15/0233 165/104.33 |
| 7,870,890 B2* | 1/2011 | Liu | ...................... | F28D 15/0275 165/104.33 |
| 9,175,912 B2* | 11/2015 | Trautman | .............. | F28D 15/046 |
| 2002/0144804 A1* | 10/2002 | Liang | ...................... | F28D 15/02 165/104.33 |

(Continued)

FOREIGN PATENT DOCUMENTS

CN 1625928 A 6/2005
TW M459692 U 8/2013

*Primary Examiner* — Robert J Hoffberg

(57) ABSTRACT

An electronic device includes a chassis, a heat source, a thermal diffusion plate, at least one heat pipe and a partition plate. The thermal diffusion plate is thermally connected to the heat source. The heat pipe includes a first end portion and a second end portion. The first end portion is fixedly connected to the thermal diffusion plate. The partition plate is arranged between the chassis and the heat pipe, and is thermally connected to the chassis and the heat pipe. The heat pipe is completely separated from the chassis.

6 Claims, 5 Drawing Sheets

(56) References Cited

U.S. PATENT DOCUMENTS

| | | | |
|---|---|---|---|
| 2009/0294114 A1* | 12/2009 | Yang | F28D 15/0266 165/185 |
| 2012/0307452 A1* | 12/2012 | Yan | G06F 1/20 361/700 |
| 2014/0340841 A1* | 11/2014 | Yu | G06F 1/203 361/679.47 |
| 2016/0021786 A1* | 1/2016 | Hata | G06F 1/203 361/700 |

* cited by examiner

A-A

B-B

C-C

ELECTRONIC DEVICE AND HEAT DISSIPATION MODULE THEREOF

RELATED APPLICATIONS

This application claims priority to Taiwan Application Serial Number 106114342, filed Apr. 28, 2017, which is herein incorporated by reference.

BACKGROUND

Field of Disclosure

The present disclosure relates to an electronic device. More particularly, the present disclosure relates to an electronic device having a heat dissipation module.

Description of Related Art

In general, because an appearance of an electronic product such as a laptop computer, a tablet computer or a smart phone is designed towards a flattening concept, its internal space is increasingly shrunk, and thus electronic components (e.g., CPU, VGA, HDD and RAM etc.) in the electronic product have to be closely arranged in the internal space of the electronic product, and accordingly, a heat dissipation problem is more and more serious.

However, when being dissipated from inside a chassis of an electronic product, heat may be rapidly transferred to a surface of the chassis, thus resulting in high surface temperature of the chassis of the electronic product.

Therefore, how to develop a solution to effectively overcome the aforementioned inconvenience and disadvantages is a serious concern for the industry.

SUMMARY

According to one embodiment of the present disclosure, an electronic device includes a chassis, a heat source, a thermal diffusion plate, at least one first heat pipe and a first partition plate. The thermal diffusion plate is thermally connected to the heat source. The first heat pipe includes a first end portion and a second end portion. The first end portion is fixedly connected to the thermal diffusion plate. The partition plate is arranged between the chassis and the first heat pipe, and is thermally connected to the chassis and the first heat pipe. The entire first heat pipe is completely separated from the chassis.

In one or more embodiments of the present disclosure, the thermal diffusion plate is arranged between the heat source and the first heat pipe.

In one or more embodiments of the present disclosure, the electronic device further includes a second partition plate. The second partition plate is sandwiched between the chassis and the first heat pipe, and a spacing is defined between the first partition plate and the second partition plate. The first end portion of the first heat pipe is in contact with the second partition plate, the second end portion of the first heat pipe is in contact with the first partition plate, and an air gap is formed between the chassis and a portion of the first heat pipe which is located between the first end portion and the second end portion.

In one or more embodiments of the present disclosure, the electronic device further includes a second heat pipe. The second heat pipe is disposed on the first partition plate. The number of the at least one first heat pipe is two, and the second heat pipe thermally contacts the second end portions of the two first heat pipes.

In one or more embodiments of the present disclosure, the first end portion and the second end portion of the first heat pipe are both disposed on a first surface of the thermal diffusion plate.

In one or more embodiments of the present disclosure, an air gap is formed between the chassis and the first surface of the thermal diffusion plate, and the first end portion and the second end portion of the first heat pipe are both disposed in the air gap.

In one or more embodiments of the present disclosure, the number of the at least one first heat pipe is two, and the two first heat pipes are symmetrically arranged on the first surface of the thermal diffusion plate.

In one or more embodiments of the present disclosure, the first partition plate comprises a protrusive portion and two supporting portions, the protrusive portion is fixedly connected to the chassis, and the supporting portions are respectively connected to two opposite sides of the protrusive portion, and an air gap is formed between the chassis and each of the supporting portions, and the supporting portions collectively support the first heat pipe.

According to another embodiment, a heat dissipation module includes a thermal diffusion plate, at least one first heat pipe and a first partition plate. The thermal diffusion plate is thermally coupled to a heat source. The first heat pipe is disposed on the thermal diffusion plate, and the first heat pipe includes a first end portion and a second end portion which are fixedly connected to the same surface of the thermal diffusion plate. The first partition plate is arranged oppositely to the thermal diffusion plate, supports the first heat pipe, and is thermally connected to the first heat pipe. A plane level of the first heat pipe being located is higher than a plane level of the first partition plate being located.

In one or more embodiments of the present disclosure, the first partition plate includes a protrusive portion and two supporting portions. The supporting portions are respectively connected to two opposite sides of the protrusive portion. The supporting portions collectively support the first heat pipe. The protrusive portion projects towards a direction of the first partition plate opposite to the first heat pipe.

Thus, by using the electronic device and its heat dissipation module of the aforementioned embodiments, the heat generated in the chassis not only can be effectively dissipated outwardly, but also would not be conducted to an outer surface of the chassis rapidly so as to prevent a local surface of the chassis of the electronic product from having high temperature.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

Figure 1:
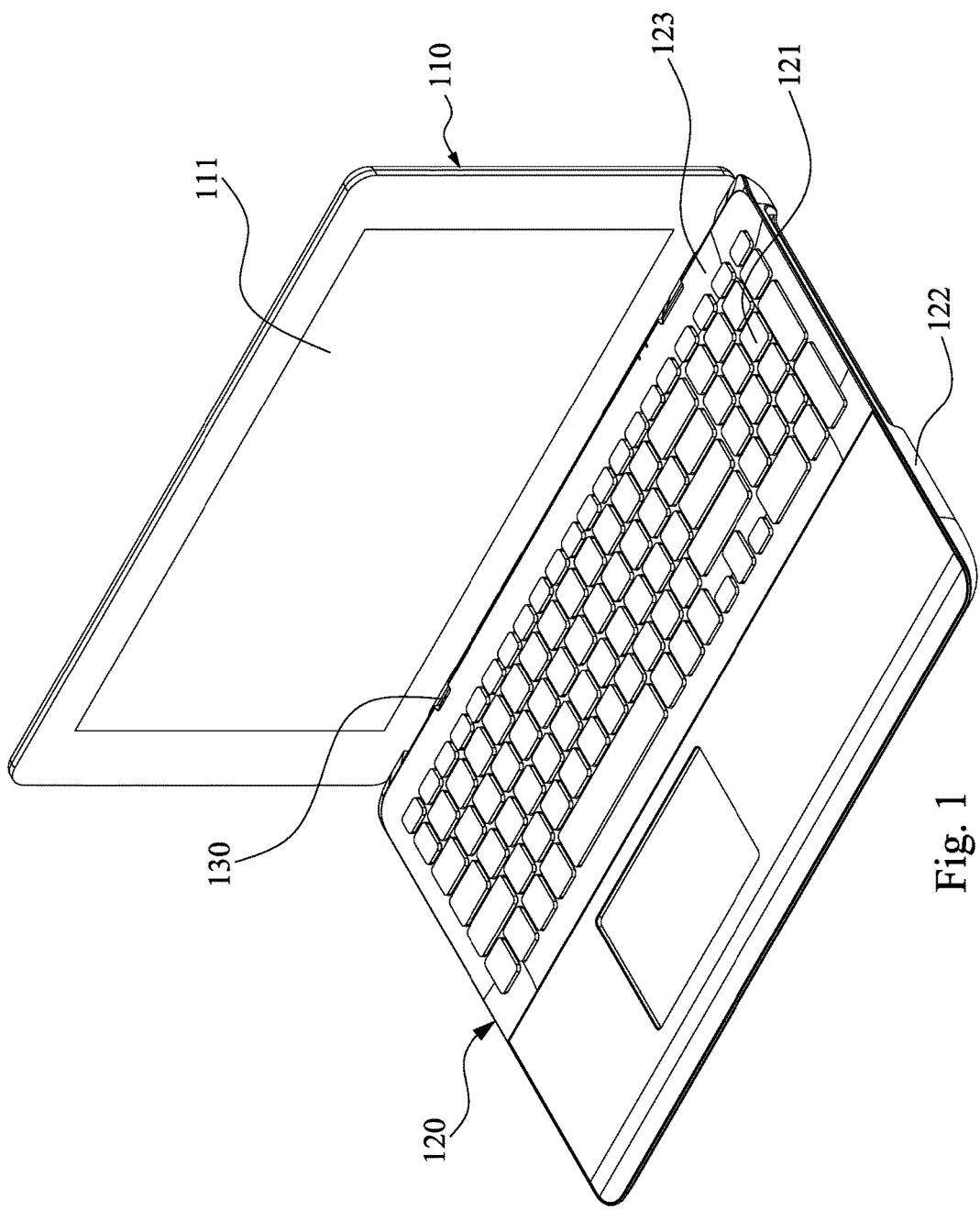
FIG. 1 is a perspective view of an electronic device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
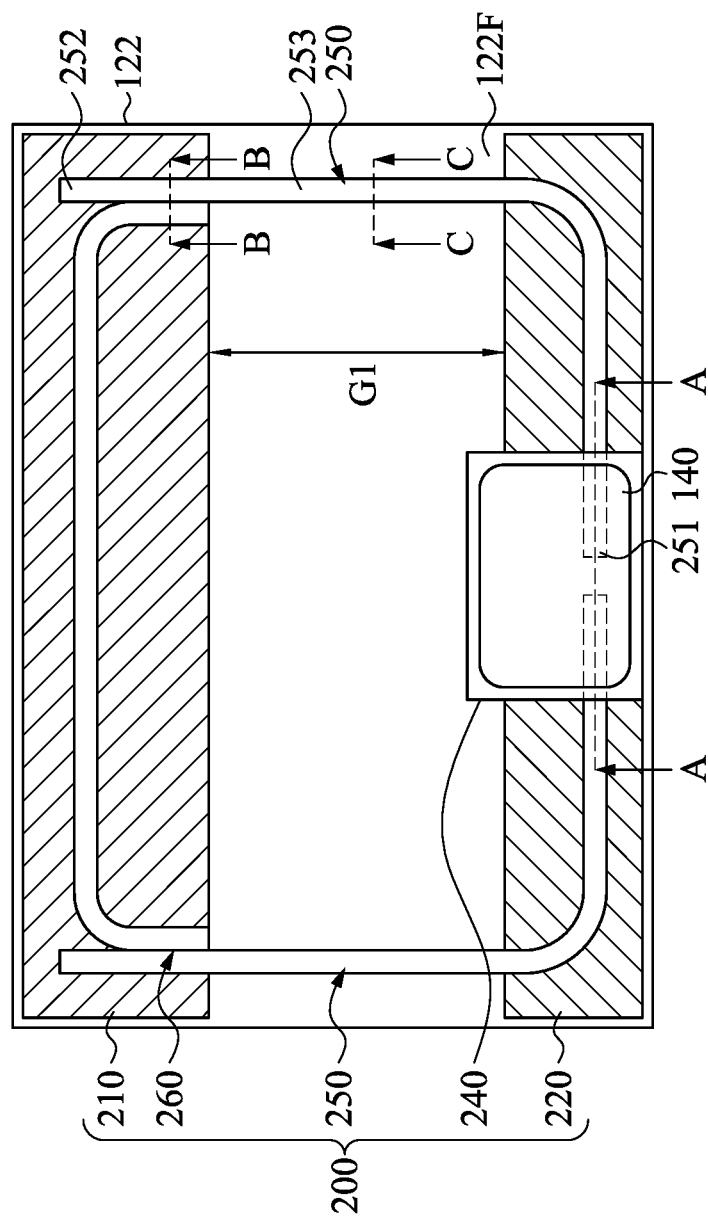
FIG. 2 is a top view of a heat dissipation module of the electronic device of FIG. 1.

Reference is now made to FIG. 1 and FIG. 2, in which FIG. 1 is a perspective view of an electronic device 100 according to one embodiment of the present disclosure, and FIG. 2 is a top view of a heat dissipation module 200 of the electronic device 100 of FIG. 1. As shown in FIG. 1 and FIG. 2, in the embodiment, the electronic device 100, for example, may be a portable electronic device or a laptop computer. The electronic device 100 includes an upper member 110, a lower member 120 and a pivot member 130 for pivotally connecting the upper member 110 to the lower member 120. The upper member 110 is provided with at least one outputting device such as a display 111. The lower member 120 is provided with at least one inputting device such as a keyboard 121. The lower member 120 further includes a first chassis 122 and a second chassis 123. The first chassis 122 is used for supporting the electronic device 100 on a loading plane (e.g., a desk surface). The second chassis 123 covers together with the first chassis 122 so as to assemble the lower member 120. The keyboard 121 is disposed on a surface of the second chassis 123. The electronic device 100 includes electronic components which are configured to enable the electronic device 100 to operate normally. The electronic components, for example, are a central processing unit (CPU), a graphics processing unit (GPU), a random access memory (RAM) and hard disks, etc. Since the electronic components will generate high temperature heat energy during operation, each of the electronic components is referred to as a heat source 140 hereinafter. The electronic device 100 further includes a heat dissipation module 200. The heat dissipation module 200 is disposed between the second chassis 123 and the first chassis 122, and is disposed on one surface (referred to an inner surface 122F hereinafter) of the first chassis 122 facing towards the second chassis 123. The heat dissipation module 200 is used to effectively dissipate the heat from the heat source 140.

Figure 3A:
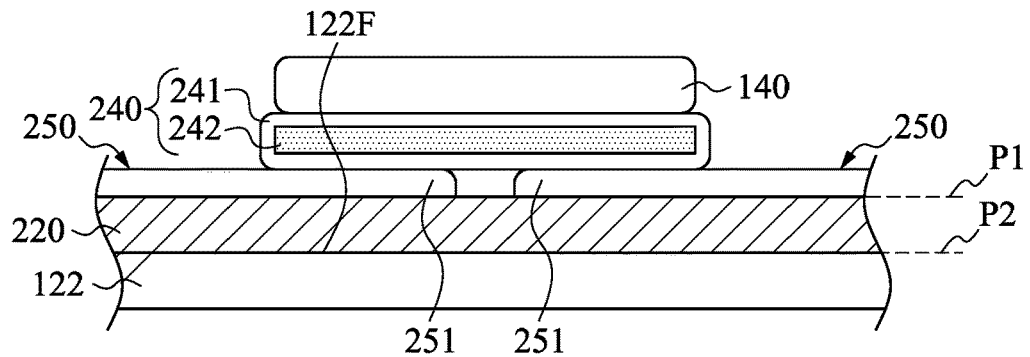
FIG. 3A is a cross-sectional view of FIG. 2 viewed along a line A-A.
Figure 3B:
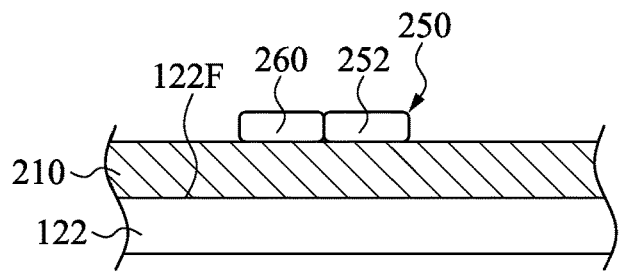
FIG. 3B is a cross-sectional view of FIG. 2 viewed along a line B-B.
Figure 3C:
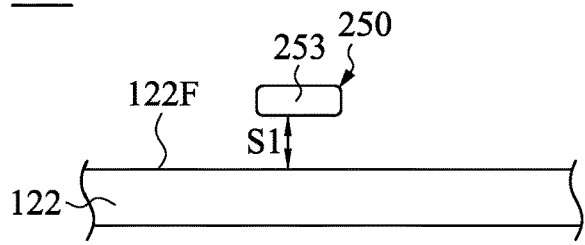
FIG. 3C is a cross-sectional view of FIG. 2 viewed along a line C-C.

Reference is now made to FIG. 3A to FIG. 3C, in which FIG. 3A is a cross-sectional view of FIG. 2 viewed along a line A-A, FIG. 3B is a cross-sectional view of FIG. 2 viewed along a line B-B, and FIG. 3C is a cross-sectional view of FIG. 2 viewed along a line C-C. As shown in FIG. 2 and FIG. 3A, in the embodiment, the heat dissipation module 200 includes a first partition plate 210, a second partition plate 220, a thermal diffusion plate 240 (such as a vapor chamber) and two heat pipes 250. The first partition plate 210 and the second partition plate 220 are respectively flatly disposed on the inner surface 122F of the first chassis 122. For example, the first partition plate 210 and the second partition plate 220 are in direct contact with the inner surface 122F of the first chassis 122. The first partition plate 210 and the second partition plate 220 are arranged separately, that is, a spacing G1 is defined between the first partition plate 210 and the second partition plate 220. The heat pipes 250 are exemplary arranged on both of the first partition plate 210 and the second partition plate 220 in a symmetrical arrangement. For example, the two heat pipes 250 are symmetrically arranged on two opposite sides of the thermal diffusion plate 240, and one portion of each of the heat pipes 250 is directly sandwiched between the thermal diffusion plate 240 and the second partition plate 220. The second partition plate 220 is sandwiched between the first chassis 122 and the heat pipes 250, and the second partition plate 220 is thermally connected to the first chassis 122 and the heat pipes 250. For example, the second partition plate 220 is in direct contact with the first chassis 122 and the heat pipes 250. The thermal diffusion plate 240 is thermally connected to the heat source 140. For example, the thermal diffusion plate 240 is in direct contact with the heat source 140. In the embodiment, the thermal diffusion plate 240 is disposed between the heat source 140 and the heat pipes 250. However, the present disclosure is not limited thereto. In another embodiment, the heat source 140 and the heat pipes 250 also may collectively contact the same surface of the thermal diffusion plate 240. In one specific embodiment, the aforementioned thermal connections thereof can be formed from a thermally conductive medium (e.g., thermal pastes) for enhancing thermal conductivity.

Specifically, each of the heat pipes 250 is in an "L" shape, and is divided into a first end portion 251, a second end portion 252, and an intermediate portion 253. The intermediate portion 253 is located between the first end portion 251 and the second end portion 252, and is in direct contact with the first end portion 251 and the second end portion 252. The first end portion 251 of each of the heat pipes 250 is fixedly connected to the thermal diffusion plate 240. For example, the first end portion 251 is welded on one surface of the thermal diffusion plate 240 facing towards the first chassis 122. The second end portion 252 of each of the heat pipes 250 is fixedly connected to the first partition plate 210. For example, the second end portion 252 is welded on one surface of the first partition plate 210 opposite to the first chassis 122 (FIG. 3B). The intermediate portion 253 is suspended on the first chassis 122, that is, an air gap 51 (FIG. 3C) is formed between the inner surface 122F of the first chassis 122 and the intermediate portion 253 of each of the heat pipes 250. However, the present disclosure is not limited to the outline appearance and arrangement of the heat pipes 250.

Furthermore, the thermal diffusion plate 240, for example, is a thermal evaporator such as a vapor chamber, and the thermal diffusion plate 240 includes a closed container 241 and a working fluid 242 received within the closed container 241. However, the thermal diffusion plate 240 is not limited to the thermal evaporator.

Since the heat pipes 250 are completely and physically disposed on the first partition plate 210 and the second partition plate 220, a plane level P1 of the heat pipes 250 which are located on the first chassis 122 is higher than a plane level P2 of the first partition plate 210 and the second partition plate 220 which are located on the first chassis 122, and the first chassis 122 is lower than the plane level P2 of the first partition plate 210 and the second partition plate 220. Thus, both of the heat pipes 250 are completely separated from the first chassis 122, that is, both of the heat pipes 250 are not in direct contact with the first chassis 122. Thus, by using the aforementioned heat dissipation module 200, not only the heat generated by the heat source 140 can be effectively dissipated outwardly, but also the outer surface of the first chassis 122 can be prevented from having high temperature.

Moreover, as shown in FIG. 2 and FIG. 3B, the heat dissipation module 200 further includes a U-shaped heat pipe 260. The U-shaped heat pipe 260 is disposed on the first partition plate 210. For example, the U-shaped heat pipe 260 is in direct contact with the first partition plate 210. Further, two opposite end portions of the U-shaped heat pipe 260 are respectively thermally connected to the respect second end portions 252 of the heat pipes 250. For example, the two opposite end portions of the U-shaped heat pipe 260 are respectively welded on the second end portion 252 of the respective heat pipes 250.

Figure 4:
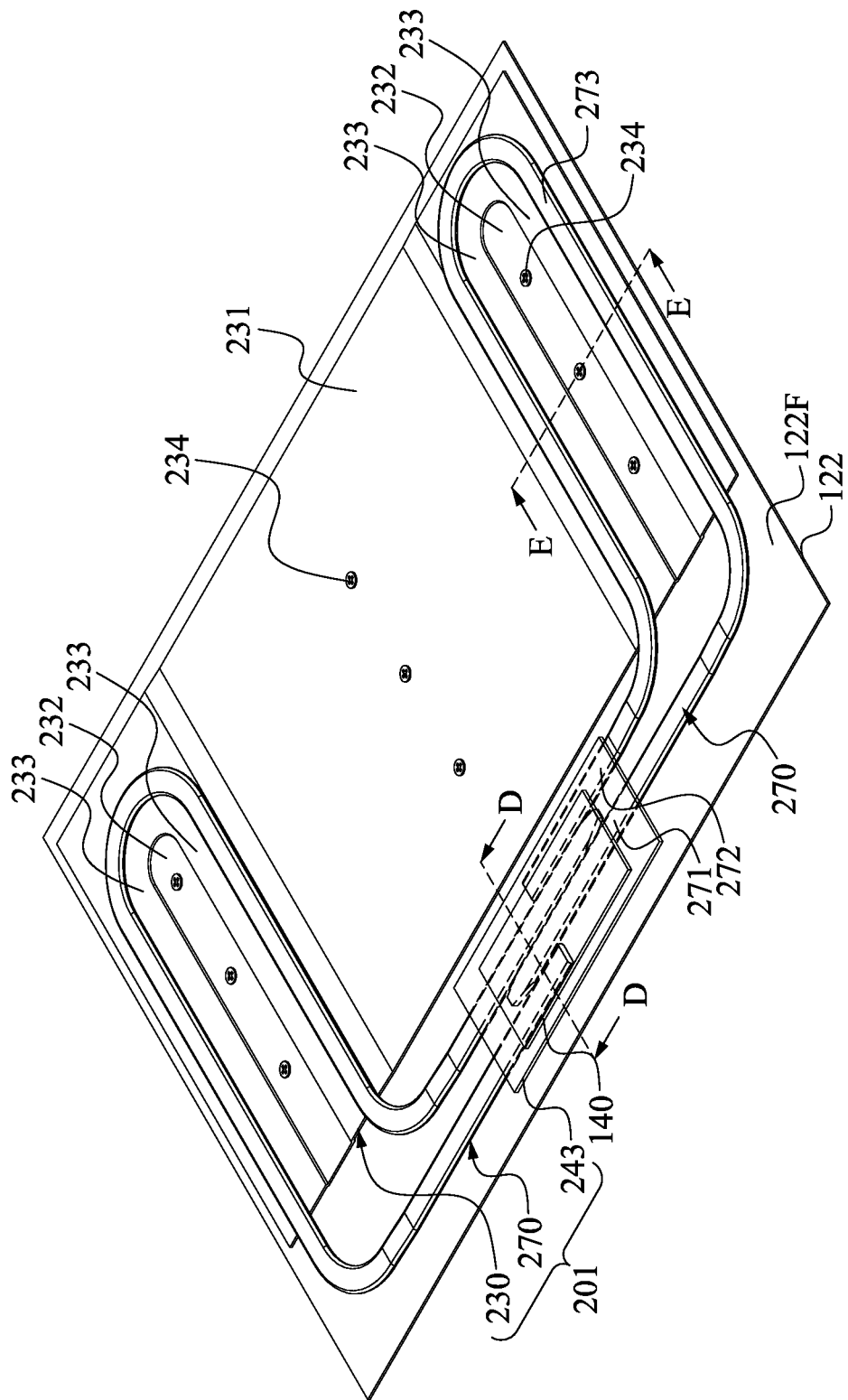
FIG. 4 is a perspective view of a heat dissipation module according to another embodiment of the present disclosure.
Figure 5A:
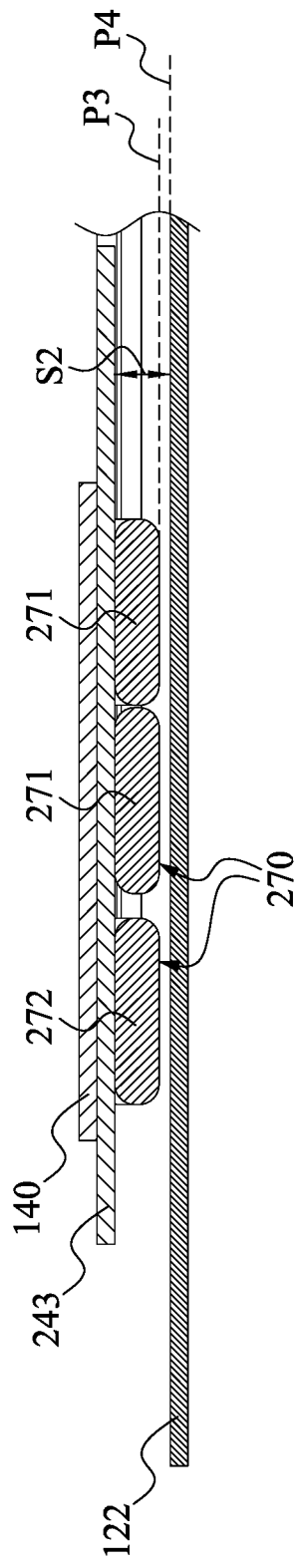
FIG. 5A is a cross-sectional view of FIG. 4 viewed along a line D-D.

Reference is now made to FIG. 4 and FIG. 5A, in which FIG. 4 is a perspective view of a heat dissipation module 201 according to another embodiment of the present disclosure, and FIG. 5A is a cross-sectional view of FIG. 4 viewed along a line D-D. As shown in FIG. 4 and FIG. 5A, in the embodiment, the heat dissipation module 201 is disposed on the inner surface 122F of the first chassis 122. The heat dissipation module 201 includes a third partition plate 230, a thermal diffusion plate 243 and two heat pipes 270. The third partition plate 230 and the thermal diffusion plate 243 are respectively disposed on the first chassis 122, and the third partition plate 230 and the thermal diffusion plate 243 are arranged separately. The third partition plate 230 is flat disposed on the inner surface 122F of the first chassis 122. For example, the third partition plate 230 is in direct contact with the inner surface 122F of the first chassis 122. The heat pipes 270 are exemplary arranged on the third partition plate 230 in a symmetrical arrangement method. For example, the heat pipes 270 are symmetrically arranged on two opposite sides of the thermal diffusion plate 243. Two opposite end portions of each of the heat pipes 270 are directly thermally connected to the same surface of the thermal diffusion plate 243. The third partition plate 230 is sandwiched between the first chassis 122 and the heat pipes 270, and is thermally connected to the first chassis 122 and the heat pipes 270. For example, the third partition plate 230 is in direct contact with the first chassis 122 and the heat pipes 270. The thermal diffusion plate 243 is thermally connected to the heat source 140. For example, the thermal diffusion plate 243 is in direct contact with the heat source 140. In the embodiment, the thermal diffusion plate 243 is disposed between the heat source 140 and the heat pipes 270. However, the present disclosure is not limited thereto. In another embodiment, the heat source 140 and the heat pipes 270 also may collectively contact the same surface of the thermal diffusion plate 243.

Specifically, each of the heat pipes 270 is divided into a first end portion 271, a second end portion 272, and a U-shaped intermediate portion 273. The U-shaped intermediate portion 273 is located between the first end portion 271 and the second end portion 272, and is in direct contact with the first end portion 271 and the second end portion 272. The first end portion 271 and the second end portion 272 of each of the heat pipes 270 are respectively fixedly connected to the thermal diffusion plate 243. For example, the first end portion 271 and the second end portion 272 of each of the heat pipes 270 are respectively welded on the same surface of the thermal diffusion plate 243. The U-shaped intermediate portion 273 is disposed on one surface of the third partition plate 230 opposite to the first chassis 122, such that both of the heat pipes 270 are completely separated from the first chassis 122. However, the present disclosure is not limited to the outline appearance and arrangement of the heat pipes 270. In addition, the thermal diffusion plate 243 is a solid metal plate, but, the thermal diffusion plate also may be a thermal evaporator.

Since one portion of each of the heat pipes 270 is disposed on the third partition plate 230, and another portion of each of the heat pipes 270 is fixedly connected to the thermal diffusion plate 243, that is, a plane level P3 at which the heat pipes 270 are situated is higher than a plane level P4 at which the inner surface 122F of the first chassis 122 are situated, and thus, both of the two heat pipes 270 are completely separated from the first chassis 122, that is, both of the two heat pipes 270 are not in direct contact with the first chassis 122. Thus, by using the aforementioned heat dissipation module 201, not only the heat generated by the heat source 140 can be effectively dissipated outwardly, but also the outer surface of the first chassis 122 can be prevented from having high temperature. Also, in the embodiment, the thermal diffusion plate 243 is fixedly connected to the heat source 140 or fixedly installed in the lower member 120 through a holding rack or a similar structure used for partially supporting the heat pipes 270.

As shown in FIG. 4 and FIG. 5A, an air gap S2 is formed between the first chassis 122 and the thermal diffusion plate 243. The first end portion 271 and the second end portion 272 of each of the heat pipes 270 are disposed in the air gap S2, and the first end portion 271 and the second end portion 272 of each of the heat pipes 270 are parallel to each other and are alternatively arranged abreast on the same surface of the thermal diffusion plate 243. Thus, since the first end portion 271 and the second end portion 272 of each of the heat pipes 270 are thermally connected to the thermal diffusion plate 243, heat conducted to the thermal diffusion plate 243 can be rapidly transferred to the third partition plate 230 through the first end portion 271 and the second end portion 272 of each of the heat pipes 270 respectively, so as to effectively dissipate the heat from the heat source 140 outwardly.

Figure 5B:
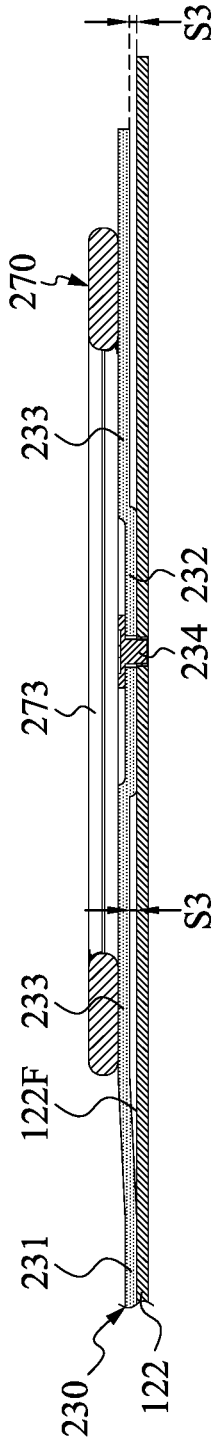
FIG. 5B is a cross-sectional view of FIG. 4 viewed along a line E-E.

FIG. 5B is a cross-sectional view of FIG. 4 viewed along a line E-E. As shown in FIG. 4 and FIG. 5B, the third partition plate 230 includes a contacting portion 231, two protrusive portions 232, and supporting portions 233. The contacting portion 231 is arranged between the two protrusive portions 232. The contacting portion 231 is fixedly connected to the inner surface 122F of the first chassis 122. For example, the contacting portion 231 is fastened on the first chassis 122 through screwing bolts 234. The protrusive portions 232 are fixedly connected to the inner surface 122F of the first chassis 122. For example, the protrusive portions 232 are fastened on the first chassis 122 through other screwing bolts 234. Every two supporting portions 233 are respectively connected to two opposite sides of each of the protrusive portions 232, in which one of the two supporting portions 233 is formed between the contacting portion 231 and one of the protrusive portions 232. Since the contacting portion 231 and the protrusive portions 232 protrude in a direction towards the third partition plate 230 (or the supporting portions 233) opposite to the heat pipes 270, one of the supporting portions 233 is suspended on the first chassis 122 and between the contacting portion 231 and the protrusive portions 232, such that an air gap S3 (FIG. 5B) is formed between the inner surface 122F of the first chassis 122 and the supporting portions 233 of the third partition plate 230. The supporting portions 233 respectively disposed on the two opposite sides of each of the protrusive portions 232 support the U-shaped intermediate portion 273 of the same heat pipe 270 from the first chassis 122, such that heat of the heat pipe 270 would not be transferred to the first chassis 122 via the third partition plate 230 with the shortest distance, thereby reducing the possibilities of causing the local surface of the chassis 122 to have high temperature.

For example but the present disclosure is not limited thereto, the third partition plate 230 may be made of a sheet metal by stamping. In the aforementioned embodiments, for example but the present disclosure is not limited thereto, the first partition plate, the second partition plate and the third partition plate may be metal sheets, graphite sheets or other sheets with high thermal conductivity. In addition, the electronic device of the present disclosure is not limited to a laptop computer only. In other embodiments, the electronic device of the present disclosure also may be a smart phone or a tablet computer.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An electronic device, comprising:
   a chassis;
   a heat source;
   a thermal diffusion plate thermally coupled to the heat source;
   at least one heat pipe, each of the at least one heat pipe comprising a first end portion and a second end portion, wherein the first end portion is fixedly connected to the thermal diffusion plate; and
   a partition plate arranged between the chassis and the at least one heat pipe, and thermally connected to the chassis and the at least one heat pipe, the partition plate comprising a protrusive portion fixedly connected to the chassis; and two supporting portions respectively connected to two opposite sides of the protrusive portion, wherein the at least one heat pipe is completely separated from the chassis, a first air gap is formed between the chassis and each of the two supporting portions, and the two supporting portions collectively support the at least one heat pipe.

2. The electronic device of claim 1, wherein the thermal diffusion plate is arranged between the heat source and the at least one heat pipe.

3. The electronic device of claim 2, wherein the first end portion and the second end portion of the at least one heat pipe are both disposed on a surface of the thermal diffusion plate.

4. The electronic device of claim 3, wherein a second air gap is formed between the chassis and the surface of the thermal diffusion plate, and the first end portion and the second end portion of the at least one heat pipe are both disposed in the second air gap.

5. The electronic device of claim 3, wherein the number of the at least one heat pipe is two, and the two heat pipes are symmetrically arranged on the surface of the thermal diffusion plate.

6. A heat dissipation module, comprising:
   a thermal diffusion plate thermally coupled to a heat source;
   at least one heat pipe disposed on the thermal diffusion plate, each of the at least one heat pipe comprising a first end portion and a second end portion which are fixedly connected to a same surface of the thermal diffusion plate; and
   a partition plate that is arranged oppositely to the thermal diffusion plate, supports the at least one heat pipe, and is thermally connected to the at least one heat pipe, and the partition plate comprising a protrusive portion and two supporting portions, wherein the two supporting portions are respectively connected to two opposite sides of the protrusive portion, the two supporting portions collectively support the at least one heat pipe, and the protrusive portion projects towards a direction of the partition plate opposite to the at least one heat pipe, wherein a plane level at which the at least one heat pipe is located is higher than a plane level at which the partition plate is located.

* * * * *